United States Patent [19]

Tee

[11] Patent Number: 4,856,455
[45] Date of Patent: * Aug. 15, 1989

[54] APPARATUS FOR HOLDING ELECTRICAL OR ELECTRONIC COMPONENTS DURING THE APPLICATION OF SOLDER

[75] Inventor: Sim A. Tee, Singapore, Singapore

[73] Assignee: Sun Industrial Coatings Private Ltd., Jalan Senang, Singapore

[*] Notice: The portion of the term of this patent subsequent to Jul. 7, 2004 has been disclaimed.

[21] Appl. No.: 43,310

[22] Filed: Apr. 28, 1987

Related U.S. Application Data

[63] Continuation of Ser. No. 760,585, Jul. 30, 1985, Pat. No. 4,677,937.

[30] Foreign Application Priority Data

Jul. 30, 1984 [GB] United Kingdom ................. 8419420

[51] Int. Cl.⁴ .............................................. B05D 5/12
[52] U.S. Cl. ..................... 118/500; 118/503; 134/137; 134/158; 134/159; 414/404; 206/328
[58] Field of Search .................. 118/500, 503; 427/96; 134/137, 158, 159; 414/404; 206/328

[56] References Cited

U.S. PATENT DOCUMENTS

| | | | |
|---|---|---|---|
| 4,635,794 | 1/1987 | Lemmer | 206/328 |
| 4,638,116 | 1/1987 | Gumb | 427/96 |
| 4,677,937 | 7/1987 | Tee | 118/503 |

Primary Examiner—Shrive Beck
Assistant Examiner—Vi Duong Dang
Attorney, Agent, or Firm—Bacon & Thomas

[57] ABSTRACT

A carrier for dual-in-line packages to be wave soldered, comprises a frame with tracks into which the packages can be slid. The tracks are defined by aligned upper and lower "U"-shaped channel members providing rails. Each track is defined between adjacent pairs of upper and lower members. Gates at either end of the tracks control movement of the packages into or out of the carrier. The carrier can be loaded and unloaded by means of apparatus including an inclined ramp on which the carrier can be releasably located, the packages being fed into the top of the ramp to fill the carrier, and sliding to the bottom of the ramp to empty the carrier of soldered packages prior to re-filling. Movement of the packages down the ramp is controlled by gates.

39 Claims, 5 Drawing Sheets

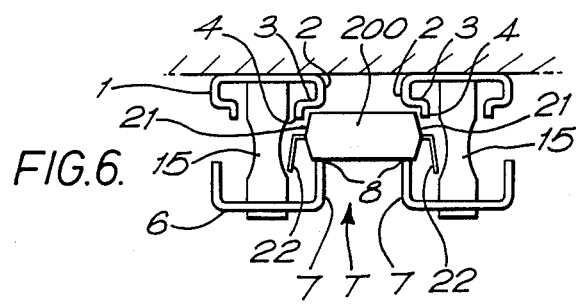
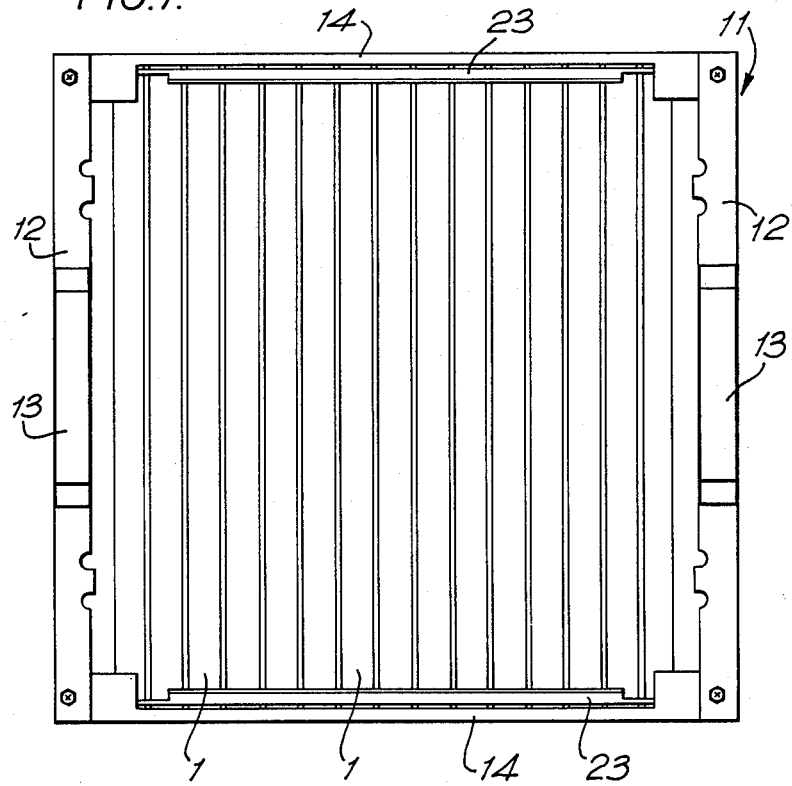

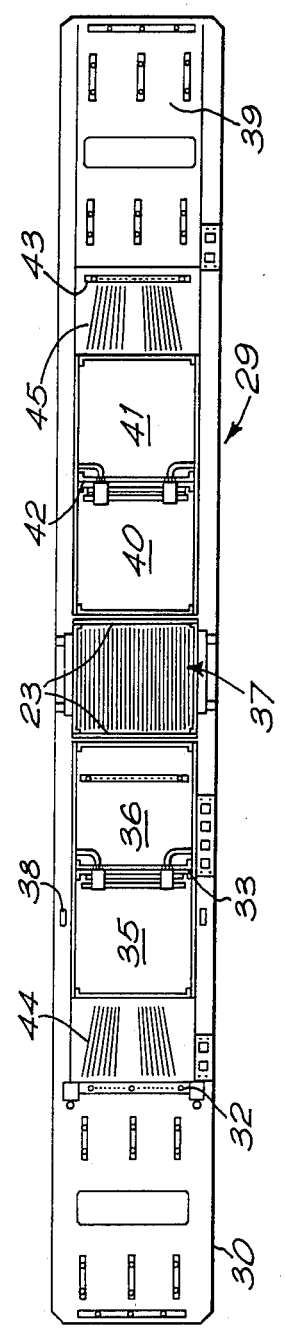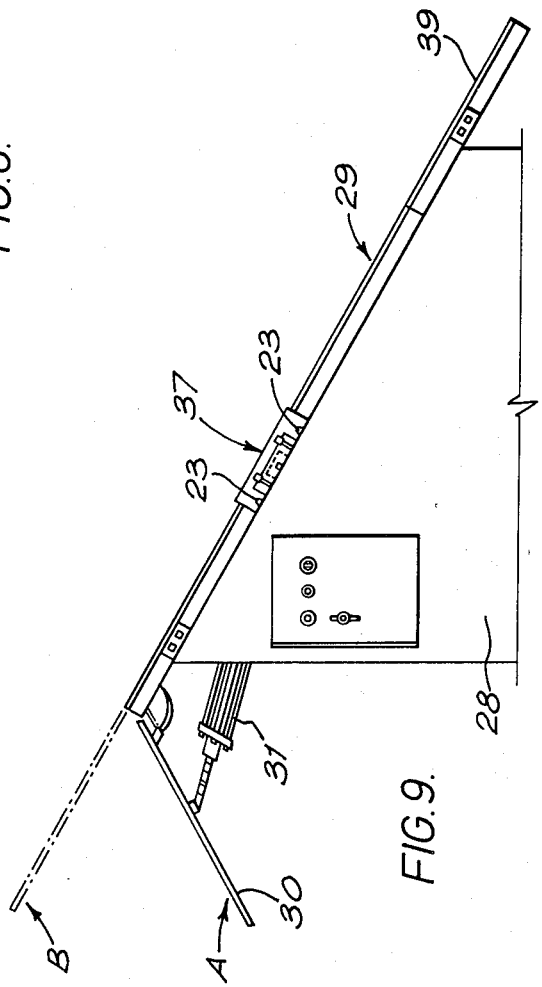
FIG.8.
FIG.9.

APPARATUS FOR HOLDING ELECTRICAL OR ELECTRONIC COMPONENTS DURING THE APPLICATION OF SOLDER

This application is a continuation of application Ser. No. 760,585, filed July 30, 1985, now U.S. Pat. No. 4,677,937.

This specification relates chiefly to apparatus for holding electrical or electronic components, particularly during the application of solder. The invention is particularly concerned with the holding of dual-in-line packages (DIPs) whilst they are being soldered.

DIPs are of generally rectangular cross section in plan view and have a row of contact pins or leads along each side. The number of leads on each side is typically seven but may range from 2 to 32 to even more. DIPs contain integrated circuits and some or all of the leads are connected to respective parts of the circuits. The DIPs are designed to be inserted into circuit boards or suitable holders and may or not be soldered in place. In any event, it is desirable that the leads be given a coating of solder and in mass production this is done by means of wave soldering apparatus.

In general, a number of DIPs are loaded in a carrier, and then subjected to processing steps of e.g. cleaning, rinsing, etching, rinsing, drying, fluxing, pre-heating, wave soldering, fan drying, hot water rinsing, drying, cooling and unloading. The carriers pass along a track during these steps and in mass production the average cycle time between loading and unloading DIPs in the carrier for wave soldering is about 20 to 22 seconds with known arrangements.

The carries must be able to withstand the temperature changes involved, particularly with repeated cycling and must permit easy access for solder to the leads of the DIPs. The carriers must be such that the DIPs will be located securely, but for commercial reasons it is desirable that as many DIPs as possible be held in a small space.

A known carrier comprises a generally rectangular frame with a number of parallel tracks, typically fourteen, for holding the DIPs. Each track consists of six parallel tungsten steel rods arranged to restrict lateral movement of the packs in any direction. During the processing steps, a gate at one end of the carrier holds the DIPs in their tracks, restricting axial movement of the rows. This gate is opened for the loading and unloading steps, the other end of the carrier being blocked permanently.

Not only is such an arrangement complex in terms of manufacture, but it is not thoroughly reliable. There is an appreciably rate of loss of DIPs possibly caused by thermally induced deformation of the tracks. The need for a gate to permit axial access to the tracks makes location of the rod ends difficult. Furthermore, the loading and unloading processes can be lengthy. In the known arrangement, unloading takes about 32 seconds and this is considerably longer than the cycle time for the processing of the DIPs. This leads to delays or to unnecessarily high numbers of carriers being required.

Viewed from one broad aspect there is disclosed in this specification a carrier for a plurality of electrical or electronic components such as dual-in-line packages or the like, comprising a frame in which is provided a plurality of parallel tracks for receiving the components, the tracks being formed by a plurality of parallel, laterally spaced, axially extending upper support members each of which has a pair of parallel, downwardly directed, axially extending rails, and a plurality of parallel, laterally spaced, axially extending lower support members aligned with and vertically spaced from the upper support members, each of the lower support members having a pair of parallel, upwardly directed, axially extending rails.

Thus, between any two adjacent pairs of aligned upper and lower support members there will be a track defined by four rails, one from each member. There will be two laterally spaced downwardly directed rails and two laterally spaced upwardly directed rails. These rails will be so arranged as to support a row of components such as DIPs and restrain vertical and horizontal movement. However, whilst effective location of the DIPs is provided, the support members themselves can be securely located whilst permitting ready axial access to the tracks.

There are a number of ways in which the four rails could support e.g. a DIP. Preferably, the DIP rests on the ends of the two upwardly directed rails. However, the rails could be stepped inwardly with respect to their respective support members so as to have laterally extending portions and the DIP could rest on these portions. Similarly, upwards movement could be restricted by the ends of the downwardly directed rails. Preferably, however, the downwardly directed rails are stepped so as to have laterally extending portions which will restrict upwards movement of the DIP. An advantage of stepped rails, is that the terminal portions can be used to restrict lateral movement of the DIP by engagement of its side. However, some DIPs may have inclined portions on their sides in which case engagement with the ends of the rails may restrict both vertical and lateral movement. In this case, stepped rails may not be necessary although they can be used to provide the correct spacing between the ends of adjacent rails.

In general, the configuration and vertical and lateral spacings of the rails will be chosen to adapt to the size and shape of the DIP or other component to be located, so as to provide suitable restriction against movement in any lateral or vertical direction. Preferably, a certain amount of tolerance is permitted to facilitate insertion of the DIPs into the tracks although care should be taken to ensure that thermal effects do not increase clearances to a level at which DIPs could be displaced from the tracks and drop out e.g. during a soldering operation.

In a particularly preferred embodiment, each support member is of "U" shaped cross section and in accordance with the preferred arrangement referred to above, the ends of the legs of the upper members are stepped inwardly.

In general, each support member will be secured to the frame by means disposed between the rails of the support member. Thus the space between two adjacent support members, where the track is defined for receiving e.g. DIPs, will be free of locating means. This provides easy axial access for the insertion or removal of DIPs. It is possible to use both ends by inserting the DIPs from one end and removing them from the other. Not only is there greater reliability and flexibility in the construction as a whole, but this improved ease of handling can reduce the unloading time to a level corresponding to or less than the cycle time for soldering, e.g. about 12 seconds.

There is disclosed herein apparatus for loading and unloading a carrier with access from both ends. The carrier itself has a gate at either end to hold the DIPs in place. The carrier is placed in the apparatus in an inclined position and means are operated to open the upper gate so that DIPs slide into the carrier. The gate is then closed and the full carrier subjected to the wave soldering process. The carrier is then placed back in the apparatus and means are operated to open the lower gate so that the DIPs slide out of the carrier. Since the DIPs can move in or out at either end, it does not matter whether or not the carrier is turned through 180° between the loading and unloading operations. This dual entry concept is particularly advantageous.

The means locating the support members could include spacers positioned at the two axial ends of aligned upper and lower members although it would be possible to have continuous or semi-continuous spacer webs. It would be possible to have two aligned upper and lower support members and a spacer formed integrally. Preferably, however, they are spear ate and this facilitates arranging for thermal movements. In one advantageous arrangement, spacers which are integral with the frame are provided at the two axial ends and the support members are located by means of slots engaged with lugs on the spaces in such a way as to allow for axial thermal movement. The slots may have a first portion to facilitate assembly with the spacer, and a second narrower portion which locks the support member to the spacer by axial movement during assembly. The axial extent of the second portion should be such as to accommodate thermally induced axial movement without the first slot portion coming into operation and causing instability of the construction. The method of locating the support members may be of use in other contexts and need not be restricted to the particular carrier described above.

In use, the leads of a DIP supported in a track will lie inside the rail of one of the support members on either side. The arrangement should be such as to provide easy access for solder to this region and this can be achieved by providing apertures in the appropriate support members. In preferred arrangement, therefore, the lower support members will be apertured whilst the upper support members need not be.

As many tracks as are desirable may be provided in the frame. If standard elements are used throughout, there will be spare half tracks at either side of the array but manufacture will be simplified.

The components can be made from any suitable material capable of withstanding the temperatures and stresses involved. Titanium may be used, and the rails may be coated e.g. with P.T.F.E. to facilitate sliding of DIPs during loading and unloading.

An embodiment exemplifying some of the above, and other, broad aspects will now be described by way of example and with reference to the accompanying drawings in which:

FIG. 6 is an enlarged partial end view showing a DIP in position;

FIG. 7 is a plan view of the carrier;

FIG. 8 is a diagrammatic plan view of apparatus for handling the carrier; and

FIG. 9 is a diagrammatic side view of the apparatus.

Figure 1A:
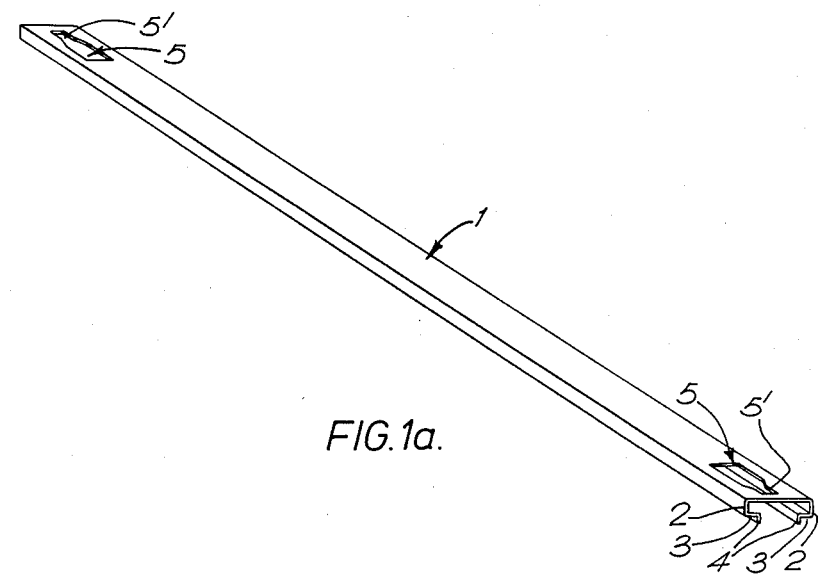
FIG. 1a and 1b are upper and lower perspective views of an upper support member for use in a carrier.
Figure 1B:
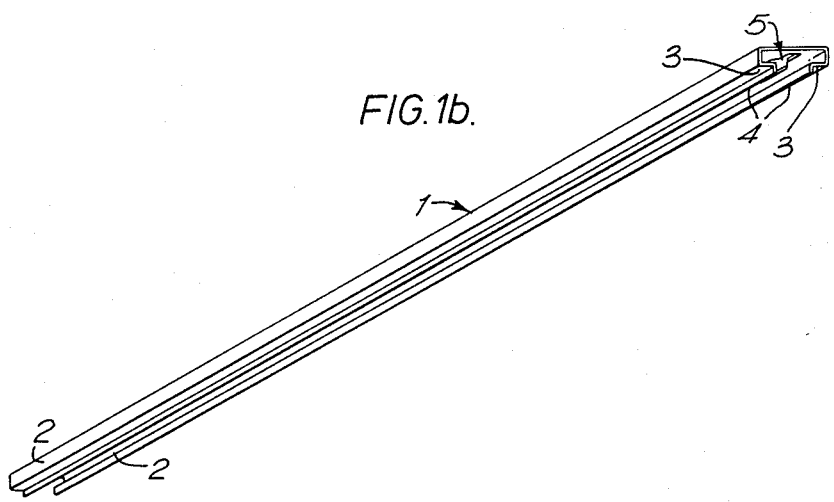

As shown in FIGS. 1a and 1b an upper support member 1 is in the form of an elongate channel of e.g. titanium coated with P.T.F.E. the cross section of the channel is generally of "U" shape but the legs, which define downwardly directed laterally spaced parallel rails 2, are stepped at 3 so that the extremities 4 are inset. At each end of the track are provided apertures 5, to be described in more detail below.

Figure 2A:
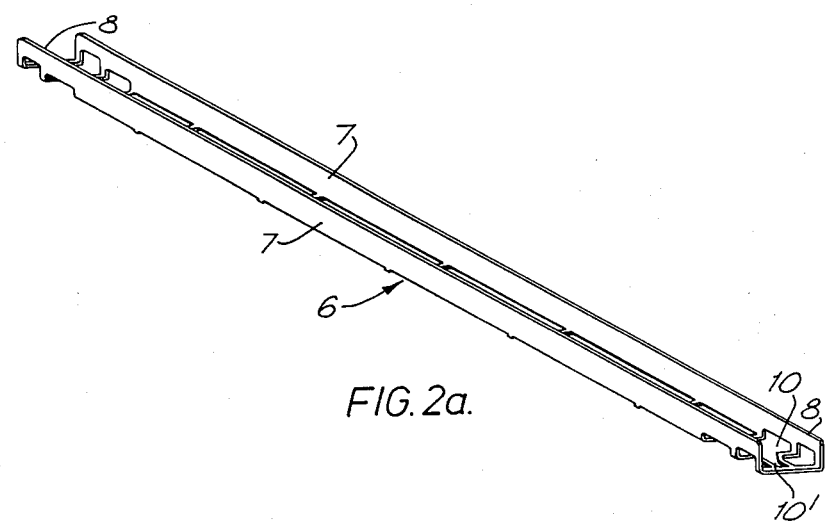
FIG. 2a and 2b are upper and lower perspective views of a lower support member for use in a carrier.
Figure 2B:
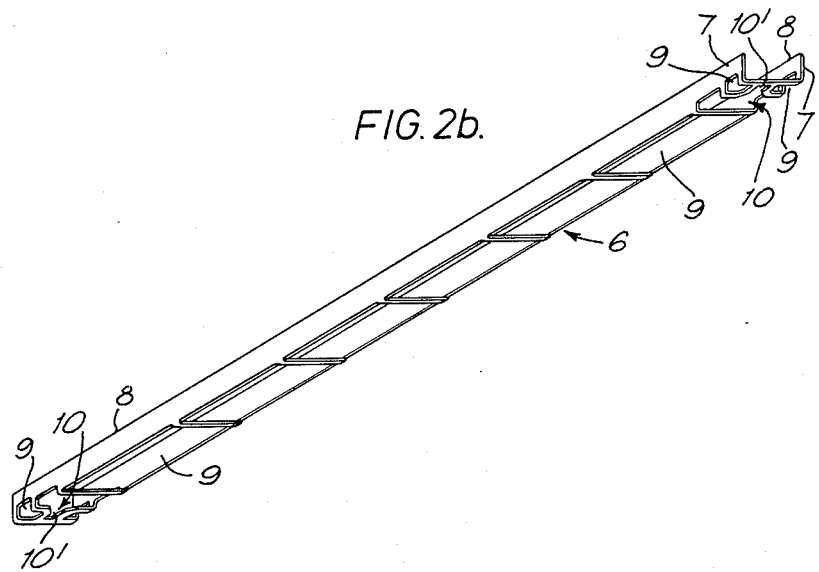

In FIG. 2a and 2b there is shown a lower support member 6. This is again in the form of an elongate channel of e.g. titanium coated with P.T.F.E. The cross section is of "U" shape, with the legs defining upwardly directed laterally spaced parallel rails 7 with extremities 8. The width of the member 6 is substantially the same as that of the upper member 1, but the spacing between the extremities 8 is greater than that between extremities 4 of rails 2 since the rails 7 are not stepped. The member 6 is provided with apertures 9 along its length to permit easy access for solder, whilst at its axial ends there are apertures 10 corresponding at apertures 5 of the upper member.

Figure 3:
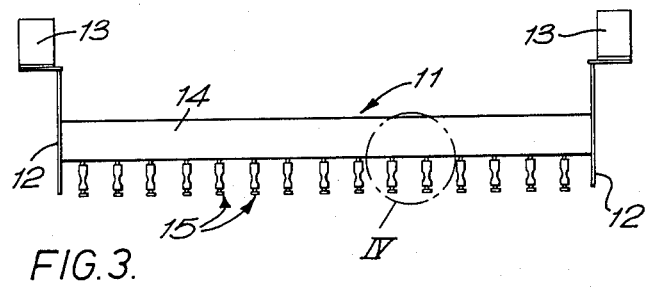
FIG. 3 is a diagrammatic end view of the carrier without the support members.
Figure 4:
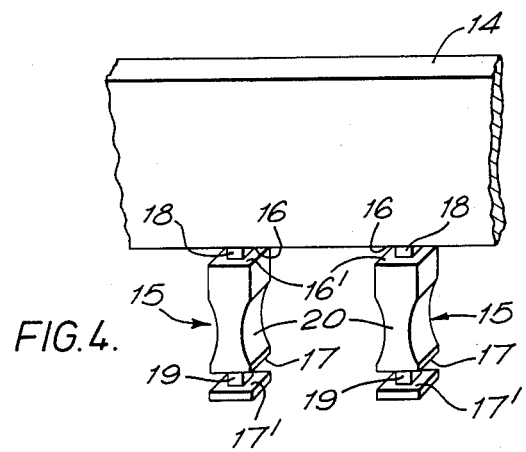
FIG. 4 is an enlarged perspective view of the part of FIG. 3 marked IV.

FIG. 3 shows a portion of a frame 11 with side members 12, carrying handles 13 and cross members 14 at either end (only one being shown) carrying fifteen downwardly directed integral mounting posts 15. As shown more clearly in FIG. 4 each post is designed to provide two pairs of surfaces i.e. 16, 16' and 17, 17'. The surfaces of each pair are separated by lugs 18 and 19 respectively of reduced cross section, whilst the two pairs are separated by a spacer portion 20. This spacer portion is waisted so as to be of reduced cross section, which inter alia reduces the thermal capacity of the arrangement.

During assembly, the upper and lower support members are attached to the mounting posts 15 at either end of the frame 11. The apertures 5 and 10 have portions which are large enough to pass over the free ends and spacer portions of the posts but once positioned between the required pair of surfaces, i.e. 16,16' or 17,17', relative axial movement will cause a smaller portion of the aperture 5 or 10 in the form of a slow 5', 10' to engage lug 18 or 19 as appropriate. The support member is then locked in place but is still capable of limited axial movement relative to the supports to allow for thermal contraction and expansion, the smaller portions of apertures 5 and 10 having a greater axial extent than lugs 18 or 19.

Figure 5:
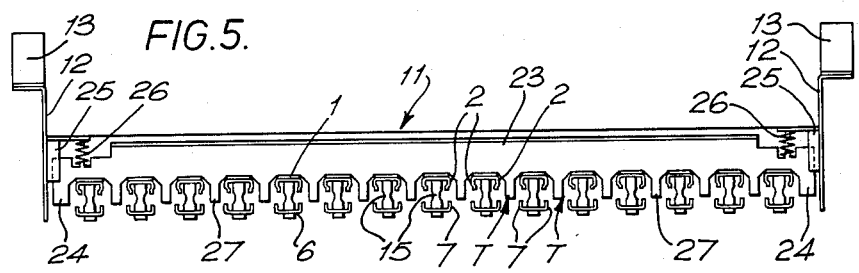
FIG. 5 is an end view of the carrier with the support members and other components in place.

FIG. 5 shows fifteen upper and lower support members 1,6 side by side on their respective mounting posts. The upper and lower support members are aligned and all of the members are axially parallel as shown in FIG. 7. As shown clearly in FIG. 6 between any two adjacent mounting posts 15 there is defined a track T comprising two rails 7 and two rails 2, the extremities 8 of rails 7 being closer together than those 4 of rails 2. The track can thus receive a row of DIPs, diagrammatically indicated at 200, the DIPs resting on extremities 8 of rails 7 and being restrained against upwards movement by stepped portions 3 and rails 2. There is a small amount of clearance between DIPs 200 and stepped portions 3. Horizontal lateral movement is restricted by means of the extremities 4 of rails 2 engaging slightly inclined side portions 21 of the DIPs. Leads of the DIPs, indicated at 22, lie inside of rails 7 but the apertures 9 in support members 6 will ensure free access for solder.

To restrain a row of DIPs against axial movement, gates 23 are provided at either end of the frame as shown in FIGS. 5 and 7. Side portions 24 are mounted in vertical guides 25 and the gates are movable upwardly against the action of springs 26 to permit removal of insertion of DIPs at either end. When in the rest position shown in FIG. 5, fingers 27 on the gate restrain the DIPs from movement. Adjusting screws, not shown, may be provided for the gates.

The metal used in the apparatus described above is titanium, and in general it should be a corrosion resistant material, capable of withstanding the conditions of use as regards temperature etc, and of a type which does not accept solder.

The arrangement described provides escape passages for poisonous fumes emitted in the soldering process. Furthermore, there is reduced wastage of water during the cleaning process, since runoff escapes down the pins of the DIPs, cleaning the leads and ensuring optimum use of water.

The apparatus can be manufactured in various specifications and sizes depending on the number, size and shape of the components to be carried. Any number of tracks may be provided, of any suitable length, and conveniently the tracks may be long enough to accommodate fourteen DIPs in a row.

To cope with DIPs of different width, the same support members 1 and 6 could be employed, but the mounting posts 15 would have different lateral spacings. With posts which are integral with the frame member 14, this member would be changed although other frame components could be retained. It might be possible to have movable posts 15 which could be re-positioned on the frame member 14. The gate 23 might need to be changed, depending on the positioning of the DIPs.

Referring now to FIGS. 8 and 9, there is disclosed schematically apparatus for loading and unloading a carrier such as that disclosed above, respectively before and after a wave soldering operation. The apparatus includes a base 28 carrying an inclined ramp 29. At the upper end of the ramp 29 is a loading platform 30 which can be pivoted between the position A shown in FIG. 9 and the dotted line position B, at which it is aligned with ramp 29, by means of a pneumatic actuator 31. In use, magazines of DIPs are placed on the loading platform 30 whilst it is in position A, following which the platform is raised to position B. Two gates 32 and 33 on the ramp 29 are then opened, whilst a gate 34 remains closed. DIPs from the platform 30 then slide down the ramp to occupy sections 35 and 36. The platform 30 is then lowered to position A to be reloaded with cartridges of DIPs.

A carrier, as described with reference to FIGS. 1 to 7, is then positioned on the ramp 29 below gate 34 in a locating region 37 where it is automatically latched into place by four latches. The two carrier gates 23 are closed at this stage. The upper gate 23 is then opened, gate 33 is closed, and 1.5 seconds later gate 34 is opened to allow DIPs in section 36 to slide down and fill the tracks in the carrier. When the carrier is full, and section 36 empty, gate 34 is closed, carrier gate 23 is closed, and gate 33 is opened to permit any DIPs in section 35 to slide down into section 36. The latches are then released and the carrier ejected and taken to wave soldering apparatus to be subjected to steps in a wave soldering operation.

If further carriers are to be filled, the process is repeated. A sensor switch 38 prevents platform 30 being raised to position B if there are any DIPs left in section 35, however.

The same apparatus is used to discharge soldered DIPs from a carrier. Thus, empty magazines are placed on unloading platform 39. A full carrier is placed on the ramp 29 and again latched in position. Its lower discharge gate 23 is opened and the DIPs slide down into sections 40 and 41, a gate 42 between them being opened.

The lower carrier gate 23 is then closed. If any DIPs are trapped, further operation is prevented until the blockage is cleared manually. The now empty carrier is then filled as described above, ejected, and replaced by a carrier full of soldered DIPs which are discharged as described above. When section 40 and 41 are filled with soldered DIPs, gate 42 is closed and a gate 43—previously closed—is opened so that the soldered DIPs pass down into the magazines on unloading platform 39. Once all the DIPs in section 41 have been discharged, gate 43 is closed, gate 42 opened, and the filled magazines on platform 39 removed.

The ramp 29 is provided with guides such as those indicated at 44 and 45, to ensure that the DIPs are correctly aligned in rows for the various steps of the unloading/loading process.

The process is repeated as many times as desired. It will be appreciated that the continuous processing which is possible, is brought about by the ability to open each end of the carrier as desired so that once in position it can be emptied and then filled. This in turn is a result of the novel manner of construction which provides easy axial access.

It will be appreciated that the novel loading/unloading apparatus and process could be employed with any other form of carrier which might be designed to have easy axial access at both ends.

Modifications may be possible both to the broad aspects and to the specific arrangements discussed above, whilst maintaining at least some of the advantageous results obtained by the carrier, apparatus or process described. It is intended that these modifications be encompassed by this disclosure, which is not to be limited in its technical scope by the appended claims which define in broad terms the protection sought for the time being. Furthermore, such claims are intended to encompass modifications and are not limited in scope to the specific arrangements described. For example, whilst the carrier is specifically intended for use in the wave soldering of DIPs it may have uses in other soldering operations or other fields, and for other components.

As regards broad aspects disclosed herein, attention is directed particularly to the process for wave soldering a plurality of electrical or electronic components, preferably dual-in-line packages in which the components are located in tracks in the carrier whilst being subjected to process steps in the wave soldering operation. Attention is also directed particularly to the broad concept of apparatus for loading or unloading the carrier with two gates, including an inclined ramp having a region adapted to receive and releasably latch in place the carrier, means for selectively opening or closing the gates of the carrier when in place, a plurality of gates on the ramp to control the passage of components down the ramp, an unloading platform at the lower end of the ramp, below the region for receiving the carrier, and a loading platform at the upper end of the ramp above the region for receiving the carrier, the loading platform being selectively movable between a first position at which components can be loaded onto the platform and a second position at which components on the platform can slide down the ramp to positions at which they can be loaded into the carrier.

What is claimed is:

1. A portable carrier for a plurality of electrical or electronic components, comprising a frame in which is provided a plurality of parallel tracks for receiving the components, the tracks being formed by a plurality of parallel, laterally spaced, axially extending upper support members each of which defines a pair of parallel, axially extending upper rails having downwardly facing portions, and by a plurality of parallel, laterally spaced, axially extending lower support members aligned with the upper support members, each of the lower support members being an elongate channel member of generally U-shaped cross section so as to define a pair of parallel, axially extending lower rails having upwardly facing portions whereby each track is defined by four rails and is situated between two adjacent upper support members and their aligned lower support members.

2. A carrier as claimed in claim 1 wherein the rails on the upper support members are stepped so as to have laterally facing portions.

3. A carrier as claimed in claim 1 wherein the lower support members are provided with apertures along their length.

4. A carrier as claimed in claim 1, wherein each of the upper support members is an elongate channel member of generally U-shaped cross section.

5. A carrier as claimed in claim 1 wherein each aligned pair of upper and lower support members is located in the frame by a mounting post at either end of the support members.

6. A carrier as claimed in claim 5 wherein the support members are joined to the mounting posts by means of slots in the support members engaging the mounting posts, the slots allowing for relative thermal movement between the support members and the posts.

7. A carrier as claimed in claim 1 wherein a gate is provided at both ends of the tracks defined by the support members, the gates being movable between a position at which components can be inserted into or removed from the tracks and a position at which components are retained in the tracks.

8. A carrier as claim in claim 7 in combination with apparatus for loading and unloading the tracks with electrical or electronic components, wherein the apparatus includes an inclined ramp having a region adapted to receive and releasably latch in place the carrier, means for selectively opening or closing the gates of the carrier when in place, a plurality of gates on the ramp to control the passage of components down the ramp, an unloading platform at the lower end of the ramp below the region for receiving the carrier and a loading platform at the upper end of the ramp above the region for receiving the carrier, the loading platform being adapted to receive components which can slide down the ramp to positions at which they can be loaded into the carrier.

9. A carrier as claimed in claim 1 in combination with a plurality of electrical or electronic components located in the tracks, each component resting on the upwardly facing portions of the lower rails and having leads on either side thereof which extend into the spaces defined within the respective U-shaped lower support members, wherein the lower support members have apertures along their length to permit the access of fluid to the leads.

10. A combination according to claim 9 wherein the downwardly facing portions of the upper rails restrict upwards movement of the components and the upper rails further have laterally facing portions which restrict lateral movement of the components.

11. A portable carrier for a plurality of electrical or electronic components, comprising a frame in which is provided a plurality of parallel tracks for receiving the components, the tracks being formed by a plurality of parallel, laterally spaced, axially extending upper support members each of which defines a pair of parallel, axially extending upper rails having downwardly facing portions, and by a plurality of parallel, laterally spaced, axially extending lower support members aligned with the upper support members, each of the lower support members defining a pair of parallel, axially extending lower rails having upwardly facing portions, whereby each track is defined by four rails and is situated between two adjacent upper support members and their aligned lower support members, there being a laterally extending array of downwardly projecting members adjacent one end of the frame and an aligned laterally extending array of downwardly projecting members adjacent the other end of the frame, each support member being mounted on and extending between an aligned pair of such downwardly projecting members.

12. A carrier as claimed in claim 11 wherein the aligned upper and lower support members are mounted in vertically spaced relationship on their respective downwardly projecting members.

13. A carrier as claimed in claim 11 wherein the support members are mounted on the downwardly projecting members by means of slots in the support members engaging the downwardly projecting members.

14. A carrier as claimed in claim 13 wherein the slots are in the form of apertures having portions permitting assembly of the support members over the downwardly projecting members, and reduced portions for engagement with reduced portions of the downwardly projecting members.

15. A carrier as claimed in claim 13 wherein the slots allow for thermally induced movement of the support members relative to the downwardly projecting members.

16. A carrier as claimed in claim 11 wherein a movable gate is provided so as to allow for insertion into and removal from the tracks of components.

17. A carrier as claimed in claim 16 wherein the gate is provided with a plurality of downwardly projecting fingers for extending into the tracks.

18. A carrier as claimed in claim 11 wherein the downwardly projecting members are in the form of relatively narrow posts.

19. A carrier as claimed in claim 11, wherein the lower support members are in the form of elongate channel members of generally U-shaped cross section.

20. A carrier as claimed in claim 19, wherein the upper support members have laterally facing portions to restrict lateral movement of components in the tracks.

21. A carrier as claimed in claim 20, wherein the upper support members are in the form of elongate channel members of generally U-shaped cross section having stepped regions defining the laterally facing portions.

22. A carrier as claimed in claim 19 wherein the lower support members have apertures provided along their length.

23. A carrier as claimed in claim 11 wherein the rails on the support members extend on either side of their respective downwardly projecting members on which they are mounted.

24. A carrier as claimed in claim 11 wherein the frame is of rectangular form having a pair of side members interconnected by cross members adjacent the ends thereof, the arrays of downwardly projecting members being provided on the respective cross members.

25. In combination, a carrier as claimed in claim 26 and apparatus for loading or unloading the carrier, wherein the apparatus includes an inclined ramp having a region adapted to receive and releasably latch in place the carrier, means for selectively opening or closing the gate of the carrier when in place, a plurality of gates on the ramp to control the passage of components down the ramp, an unloading platform at the lower end of the ramp below the region for receiving the carrier and a loading platform at the upper end of the ramp above the region for receiving the carrier, the loading platform being adapted to receive components which can slide down the ramp to positions at which they can be loaded into the carrier.

26. A combination as claimed in claim 25 wherein the carrier is such as to permit access to the tracks at both ends of the frame and a gate is provided at both ends of the frame.

27. A carrier as claimed in claim 16 wherein a gate is provided at each end of the frame so as to permit access to the tracks at both ends.

28. A carrier for arraying and supporting a plurality of components to be soldered, comprising: a frame designed to be moved through a soldering operation; a plurality of lower support members extending in the frame and adapted to support the lower side of the components, a plurality of upper support members extending above and in parallel with said lower support members so as to restrict vertical movement of the components by engaging the upper side thereof; said upper support members being connected to the frame; and openings providing access to tracks for the components defined by said upper and lower support members; wherein the lower support members are made of elongate channel members with a substantially U-shaped cross section, each of said elongate channel members having apertures formed in the floor thereof.

29. A carrier as claimed in claim 28 wherein the components are supported by the vertical side walls of the lower support members.

30. Apparatus for loading and unloading components into a portable carrier having plurality of parallel tracks each of which can receive a plurality of components, access to and from the tracks being possible from either end and being controlled by movable gates on the carrier, the apparatus comprising an inclined ramp having a region adapted to receive and releasably latch in place the carrier, means for selectively opening and closing the carrier gates when the carrier is latched in place, a loading platform at the upper end of the ramp above the region for receiving the carrier, the loading platform having means for receiving a plurality of components, at least one movable gate on the apparatus to control movement of the components down the ramp into the carrier receiving region, an unloading platform at the lower end of the ramp below the region for receiving the carrier, and at least one movable gate on the apparatus to control movement of components down the ramp from the carrier receiving region to the unloading platform.

31. Apparatus as claimed in claim 30, wherein there is provided a plurality of spaced gates between the loading platform and the carrier receiving region.

32. Apparatus as claimed in claim 30 wherein upper, intermediate and lower spaced gates are provided between the loading platform and the carrier receiving region.

33. Apparatus as claimed in claim 32, wherein the gates are controlled by means such that the upper gate is initially closed to prevent components sliding from the loading platform, the upper gate is subsequently opened whilst the lower gate is in the closed condition and the intermediate gate is in the open condition to permit components to occupy the space between the upper and lower gates, the intermediate gate is subsequently closed, and the lower gate is subsequently opened to permit components occupying the space between the intermediate and lower gates to pass into a carrier, the lower gate is closed, and the intermediate gate is opened to permit components to pass from the region above the intermediate gate into the space between the intermediate and lower gates.

34. Apparatus as claimed in claim 30, wherein there is provided a plurality of spaced gates between the carrier receiving region and the unloading platform.

35. Apparatus as claimed in claim 34 wherein upper and lower spaced gates are provided between the carrier receiving region and the unloading platform 36. Apparatus as claimed in claim 35, wherein the gates are controlled by means such that when the gate of a carrier is opened to permit components to pass down the ramp in an unloading operation, the lower gate is closed and the upper gate is opened to permit components to occupy the space between the carrier and the lower gate, the upper gate is subsequently closed, the lower gate is subsequently opened to permit components occupying the space between the upper and lower gates to pass down the ramp to the unloading platform, the lower gate is closed and the upper gate is opened to permit components to pass from above the upper gate into the space between the upper and lower gates.

37. Loading and unloading apparatus as claimed in claim 30, in combination with the portable carrier having a plurality of parallel tracks each of which can receive a plurality of components, access to and from the tracks being possible from both ends of the carrier and being controlled by the movable gate at both ends of the carrier.

38. A combination as claimed in claim 37 wherein the arrangement is such that a loaded carrier can be placed in the carrier receiving region, unloaded and then re-loaded with fresh components in a linear operation.

39. Apparatus as claimed in claim 30, wherein the loading platform is pivotal between a first position at which the platform is inclined downwardly with respect to the ramp to facilitate the loading of components onto the platform, and a second position at which the platform is aligned with the ramp to enable components to slide down the ramp from the platform.

* * * * *